(12) United States Patent
Hambardzumyan et al.

(10) Patent No.: US 10,474,784 B2
(45) Date of Patent: Nov. 12, 2019

(54) METHOD AND SYSTEM FOR DEFINING GENERIC TOPOLOGIES FOR USE IN TOPOLOGY MATCHING ENGINES

(75) Inventors: Minas Hambardzumyan, Plano, TX (US); Michael J. Krasnicki, Richardson, TX (US); Ryan W. Eatmon, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

(21) Appl. No.: 12/641,131

(22) Filed: Dec. 17, 2009

(65) Prior Publication Data

US 2011/0154275 A1 Jun. 23, 2011

(51) Int. Cl.
*G06F 17/50* (2006.01)

(52) U.S. Cl.
CPC .................. *G06F 17/5081* (2013.01)

(58) Field of Classification Search
USPC ......................................................... 716/100
See application file for complete search history.

(56) References Cited

U.S. PATENT DOCUMENTS

| | | | |
|---|---|---|---|
| 5,689,432 A | 11/1997 | Blaauw et al. | |
| 5,796,638 A | 8/1998 | Kang et al. | |
| 6,058,492 A | 5/2000 | Sample et al. | |
| 6,086,627 A | 7/2000 | Bass, Jr. et al. | |
| 6,493,850 B2 | 12/2002 | Venugopal et al. | |
| 6,725,439 B1 | 4/2004 | Homsinger et al. | |
| 6,810,509 B2 | 10/2004 | Murakami | |
| 6,907,589 B2 | 6/2005 | Frank et al. | |
| 7,114,137 B2 | 9/2006 | Hayashi | |
| 7,237,209 B2 | 6/2007 | Strickland et al. | |
| 7,243,317 B2 | 7/2007 | Wang et al. | |
| 7,302,378 B2 | 11/2007 | Hayashi | |
| 2004/0243949 A1* | 12/2004 | Wang et al. ................. | 716/4 |
| 2008/0134104 A1* | 6/2008 | Chapman et al. ............ | 716/2 |
| 2008/0148211 A1 | 6/2008 | Dai et al. | |
| 2008/0282212 A1* | 11/2008 | Dennison ............ G06F 17/5045 | 716/122 |

(Continued)

OTHER PUBLICATIONS

"A Technology-Independent CAD Tool for ESD Protection Device Extraction—ESDExtractor," Proceedings of the 2002 IEEE/ACM International Conference on Conference on Computer-Aided Design, pp. 510-513, Nov. 10-14, 2002, San Jose, California (R.Y. Zhan, H.G. Feng, Q. Wu, G. Chen, X.K. Guan and Albert Z. Wang).

(Continued)

*Primary Examiner* — Bryce M Aisaka
(74) *Attorney, Agent, or Firm* — John R. Pessetto; Charles A. Brill; Frank D. Cimino

(57) ABSTRACT

Circuit analysis software packages are a significant tool used today in the design of integrated circuits (ICs). Many of the conventional and commercially available simulation or analysis packages, however, are limited to performing static design "checks" using topology based search algorithms to find potential problems in a subject design. Here, a system is provided that allows a user to define parameters that comport with the subject design to generate a set of specific topologies from a set of generic topologies. These generated topologies can then be used to perform a more thorough analysis of the subject design.

22 Claims, 5 Drawing Sheets

(56) References Cited

U.S. PATENT DOCUMENTS

2009/0094568 A1    4/2009   Shukla et al.
2009/0154037 A1*   6/2009   Voldman ......................... 361/56

OTHER PUBLICATIONS

"ESDExtractor: A New Technology-Independent CAD Tool for Arbitrary ESD Protection Device Extraction," IEEE Transactions on Computer-Aided Design of Integrated Circuits and Systems, vol. 22, No. 10, Oct. 2003, pp. 1362-1370 (Rouying Zhan, Haigang Feng, Qiong Wu, Haolu Xie, Xiaokang Guan, Guang Chen and Albert Z.H. Wang).

"ESDInspector a New Layout-Level ESD Protection Circuitry Design Verification Tool Using a Smart-Parametric Checking Mechanism," IEEE Trans. Computer-Aided Design Integr. Circuits Syst., vol. 23, Oct. 2004, pp. 1421-1424 (Rouying Zhan, Haigang Feng, Qiong Wu, Haolu Xie and Albert Z.H. Wang).

* cited by examiner

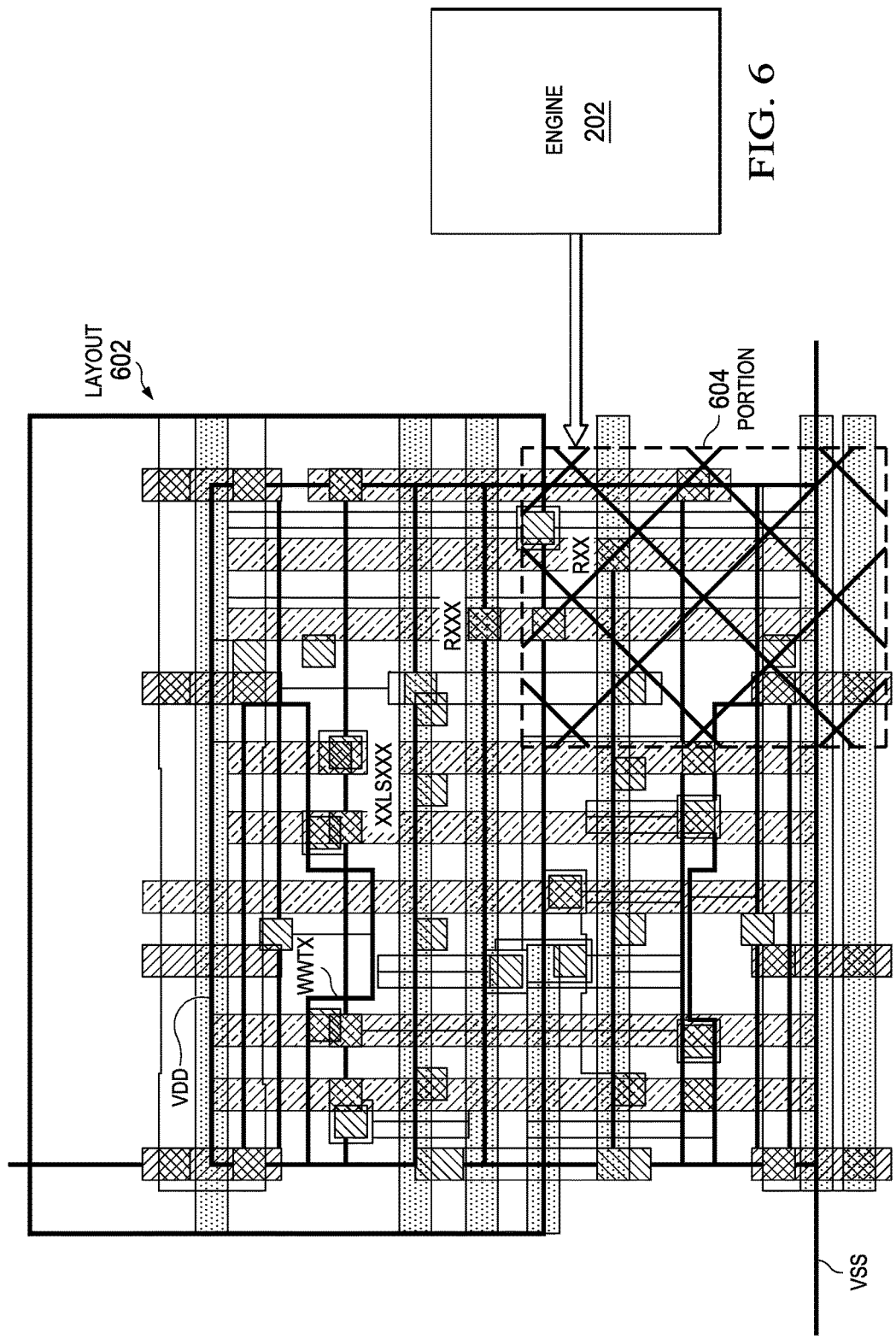

METHOD AND SYSTEM FOR DEFINING GENERIC TOPOLOGIES FOR USE IN TOPOLOGY MATCHING ENGINES

TECHNICAL FIELD

The invention relates generally to circuit analysis software and, more particularly, to software used for determining electrostatic discharge (ESD) sensitivity.

BACKGROUND

During the design of an integrated circuit (IC), it is routine practice to determine whether the design can satisfy/survive numerous industry standard ESD tests. Usually, this check is performed after the IC layout is complete, meaning that if there is a significant issue with ESD sensitivity or another design concern, a designer may have to recreate a layout for the IC. It is very desirable to have software that will generally ensure satisfactory operation during ESD tests at various points in design process and well as perform other design "checks."

To date, there are several software packages in existence that perform these types of analyses. These packages, however, perform static design "checks" using topology based search algorithms to find potential problems (i.e., ESD sensitivity) in a subject design. Completeness of these "checks" depends on the completeness of the defined topologies, and a subject design may not be considered "problem free" for alternative topologies that are not explicitly defined. Definition of such a large set of topologies, especially over a variety of technologies (i.e., CMOS or BiCMOS process technologies) is very difficult. Thus, there is a need for a software package with a greater search range.

Some other conventional methods and/or systems are: U.S. Pat. Nos. 5,689,432; 5,796,638; 6,058,492; 6,086,627; 6,493,850; 6,725,439; 6,810,509; 7,114,137; 6,907,589; 7,237,209; 7,243,317; 7,302,378; U.S. Patent Pre-Grant Publ. No. 2004/0243949; U.S. Patent Pre-Grant Publ. No. 2008/0148211; U.S. Patent Pre-Grant Publ. No. 2009; 0094568; Zhan et al., "A technology-independent CAD tool for ESD protection device extraction: ESDExtractor," *Proceedings of the 2002 IEEE/ACM international conference on Computer-aided design*, p. 510-513, Nov. 10-14, 2002, San Jose, Calif.; Zhan et al., "ESDExtractor: A new technology-independent CAD tool for arbitrary ESD protection device extraction," *IEEE Tran. Computer-Aided Design*, vol. 22, pp. 1362-1370, October 2003; and Zhan et al., "ESDInspector: A new layout-level ESD protection circuitry design verification tool using a smart-parametric checking mechanism," *IEEE Trans. Comput.-Aided Design Integr. Circuits Syst.*, vol. 23, pp. 1421, October 2004.

SUMMARY

A preferred embodiment of the present invention, accordingly, provides a processor having a computer program embodied thereon. The computer program product comprises computer code for receiving a circuit design; computer code for receiving a list of fundamental devices; computer code for receiving a topology map for the circuit design; computer code for retrieving rules based at least in part on the list of fundamental devices and the topology map; computer code for generating a plurality of circuit topologies based at least in part on the retrieved rules, the list of fundamental devices, and the topology map; computer code for comparing at least a portion of the circuit design to the plurality of circuit topologies to identify which of the circuit topologies are present in the circuit design; and computer code for analyzing the circuit design based at least in part on the comparison of the portion of the circuit design to the plurality of circuit topologies.

In accordance with a preferred embodiment of the present invention, the computer code for generating the plurality of circuit topologies based at least in part on the retrieved rules, the list of fundamental devices, and the topology map further comprises: computer code for retrieving a set of generic circuit topologies from a topology database; computer code for generating the plurality of circuit topologies from the set of generic circuit topologies based at least in part on the retrieved rules, the list of fundamental devices, and the topology map.

In accordance with a preferred embodiment of the present invention, the topology map defines nodes that can be shorted together.

In accordance with a preferred embodiment of the present invention, the computer code for generating the plurality of circuit topologies from the set of generic circuit topologies based at least in part on the retrieved rules, the list of fundamental devices, and the topology map further comprises computer code for generating permutations for each generic topology based at least in part on the nodes that can be shorted together.

In accordance with a preferred embodiment of the present invention, the topology map defines nodes that can be shorted to pads.

In accordance with a preferred embodiment of the present invention, the computer code for generating the plurality of circuit topologies from the set of generic circuit topologies based at least in part on the retrieved rules, the list of fundamental devices, and the topology map further comprises computer code for generating permutations for each generic topology based at least in part on the nodes that can be shorted to the pads.

In accordance with a preferred embodiment of the present invention, the topology map defines device sockets.

In accordance with a preferred embodiment of the present invention, the computer code for generating the plurality of circuit topologies from the set of generic circuit topologies based at least in part on the retrieved rules, the list of fundamental devices, and the topology map further comprises: computer code determining a technology for the circuit design; and computer code for matching fundamental devices from the fundamental device list within the technology to the device sockets.

In accordance with a preferred embodiment of the present invention, the technology is a BiCMOS process technology.

In accordance with a preferred embodiment of the present invention, the computer code for analyzing the circuit design based at least in part on the comparison of the portion of the circuit design to the plurality of circuit topologies further comprises computer code for determining electrostatic discharge (ESD) sensitivity of the circuit design based at least in part on the comparison of the portion of the circuit design to the plurality of circuit topologies.

In accordance with a preferred embodiment of the present invention, the topology map defines fundamental devices coupled in parallel to one another.

In accordance with a preferred embodiment of the present invention, the topology map defines fundamental devices coupled in series to one another.

In accordance with a preferred embodiment of the present invention, an apparatus for analyzing a circuit design is provided. The apparatus comprises a storage medium having a circuit topology database and a rules database stored thereon, wherein the circuit topology database includes a plurality of generic circuit topologies, and wherein the rules database includes a plurality of rules, wherein each rule is associated with at least one of the generic circuit topologies; and a processor having an engine embodied thereon that is in communication with the storage medium, wherein the engine includes: computer code for receiving a circuit design; computer code for receiving a list of fundamental devices; computer code for receiving a topology map for the circuit design; computer code for retrieving rules based at least in part on the list of fundamental devices and the topology map; computer code for generating a plurality of circuit topologies based at least in part on the retrieved rules, the list of fundamental devices, and the topology map; computer code for comparing at least a portion of the circuit design to the plurality of circuit topologies to identify which of the circuit topologies are present in the circuit design; and computer code for analyzing the circuit design based at least in part on the comparison of the portion of the circuit design to the plurality of circuit topologies.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4-6 are diagrams depicting example operations of portions of the system of FIG. 2.

DETAILED DESCRIPTION

Figure 1:
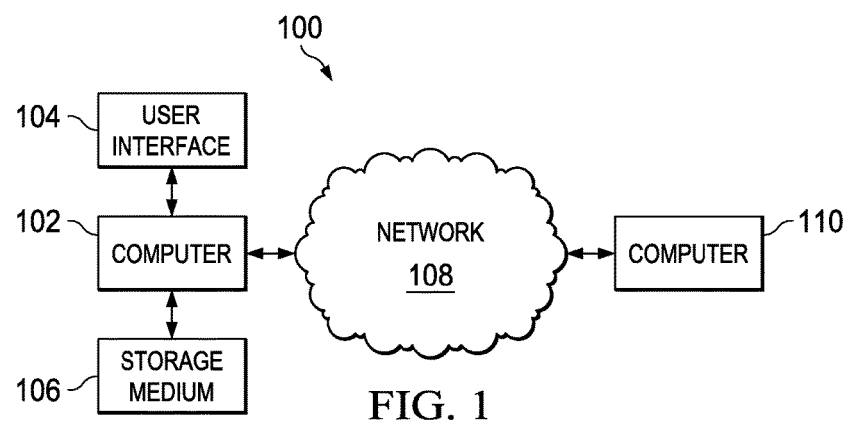
FIG. 1 is a block diagram of a network employing a system in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally depicts a network employing a system in accordance with a preferred embodiment of the present invention. The network 100 generally comprises a terminal (which can include computer 102, user interface 104, and storage medium 106), a network 108 (such as a packet switching network), and a computer 110. Generally, circuit analyses consume a great deal of computing resources, especially when a subject circuit is very large. Thus, it is common to use a network, such as network 100, to perform circuit analyses.

Figure 2:
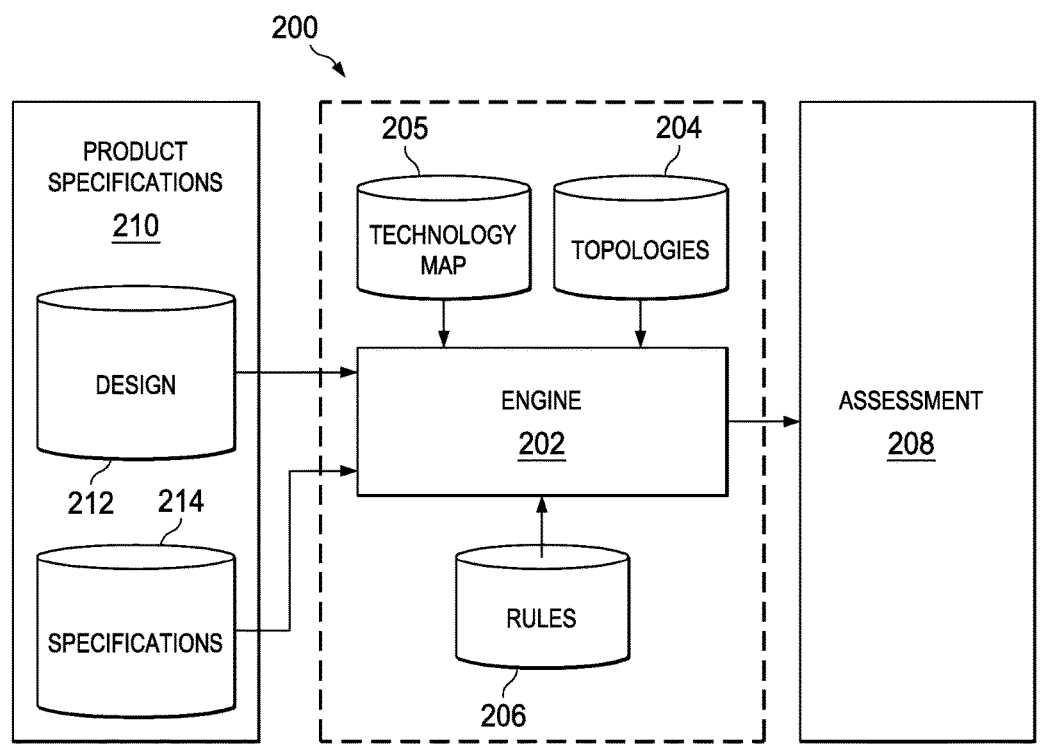
FIG. 2 is a block diagram an example of the system of FIG. 1.
Figure 3:
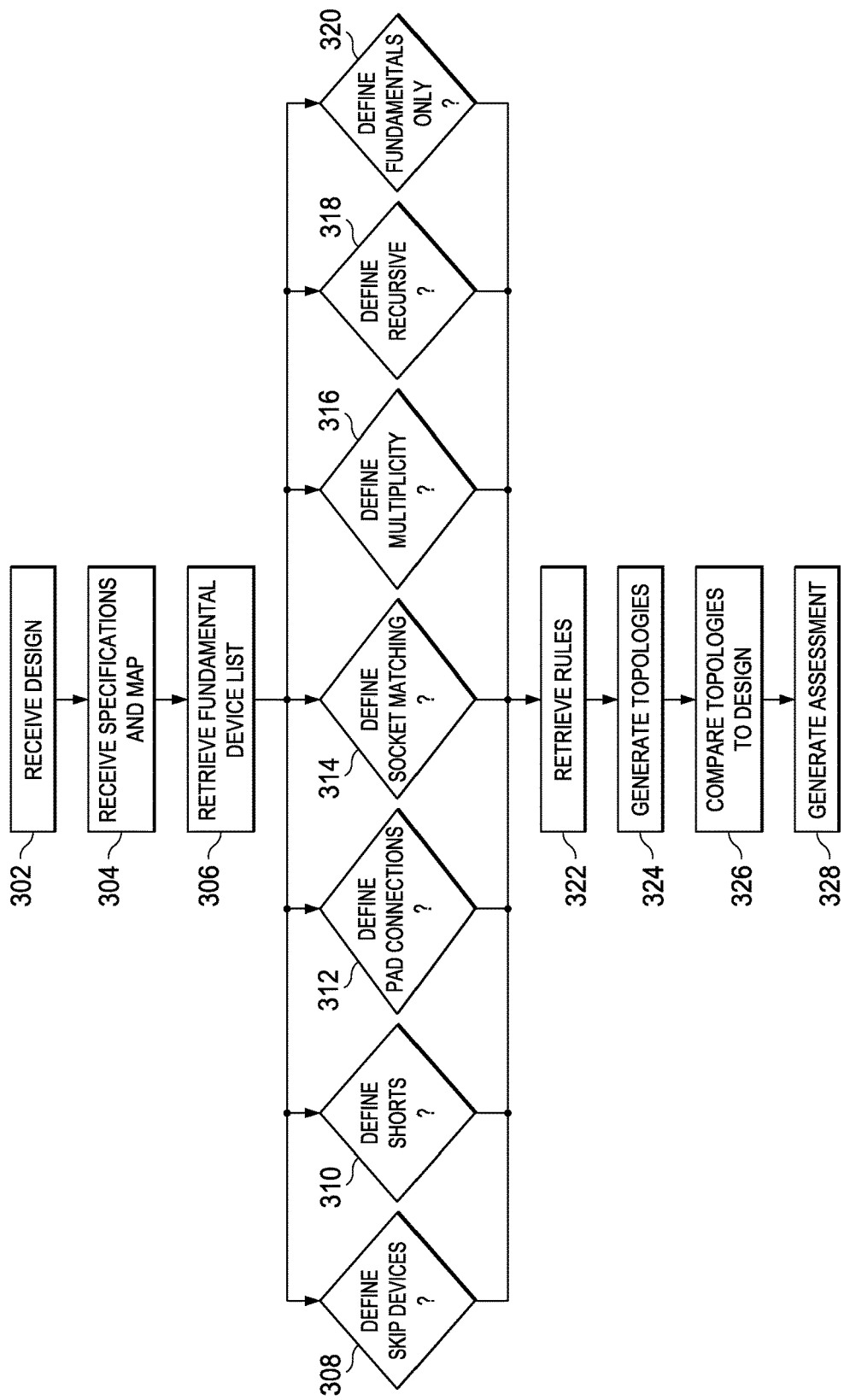
FIG. 3 is a flow chart depicting the operation of the system of FIG. 2.

Turning now to FIGS. 2 and 3, an example of a system 200 in accordance with a preferred embodiment of the present invention is shown. System 200 generally comprises an engine 202, a topology database 204, technology map database 205, and a technology rules database 206. This system 200 generally receives (in steps 302 and 304) a product specification 210 (which include a design 212 and the specifications 214) and makes an assessment 208. Generally, the product specification 210 references a list of "fundamental" devices (such as transistors), which are retrieved from topology database 205 in step 306. For example, a user may provide a schematic (which serves as the design 212) and may identify NMOS transistors and PMOS transistors as fundamental devices (indicating that the engine 202 can ignore the remaining devices, like resistors and capacitors, which are known as "skip devices").

Once the list of fundamental devices is identified by engine 202, the engine 202 reads the topology map by making several determinations generally in parallel. With the list of fundamental devices, engine defines the skip devices in step 308 and 320, whether implicitly or explicitly identified. Within the specification 210, the user may also identify shorts (or short circuits) between electrodes of the fundamental devices and pads (i.e., package terminals), which engine 202 can identify in steps 310 and 312. Engine 202 can also determine socket matching (which is largely based on the technology identified in specification 210 and described by example below) in step 312, determine multiplicity (i.e., devices or topologies in parallel) in step 316, and determine whether there is recursive usage (i.e., devices or topologies in series or cascoded) in step 318. Additionally, the user may also "on-the-fly" identifications for steps 308, 310, 312, 314, 316, 318, and 320 not present in the specification 210.

With identification of the features of the topology map, engine 202 can then conduct its analysis. Based on the technology (i.e., BiCMOS process) and the topology map, the engine 202 can retrieve the relevant rules from the rules database 206 in step 322 and can generate topologies (from a generic set of topologies stored in topology database 204) in step 324 from the retrieved rules from database 206 and the topology map. These generated topologies are then compared to the portions of the design 212 in step 326 to identify whether these any of these generated topologies are found in the design 212. Based on these comparisons, a general assessment (i.e., electrostatic discharge (ESD) sensitivity) can be made in step 328 based on whether the generated topologies which are found in the design 212.

Figure 4:
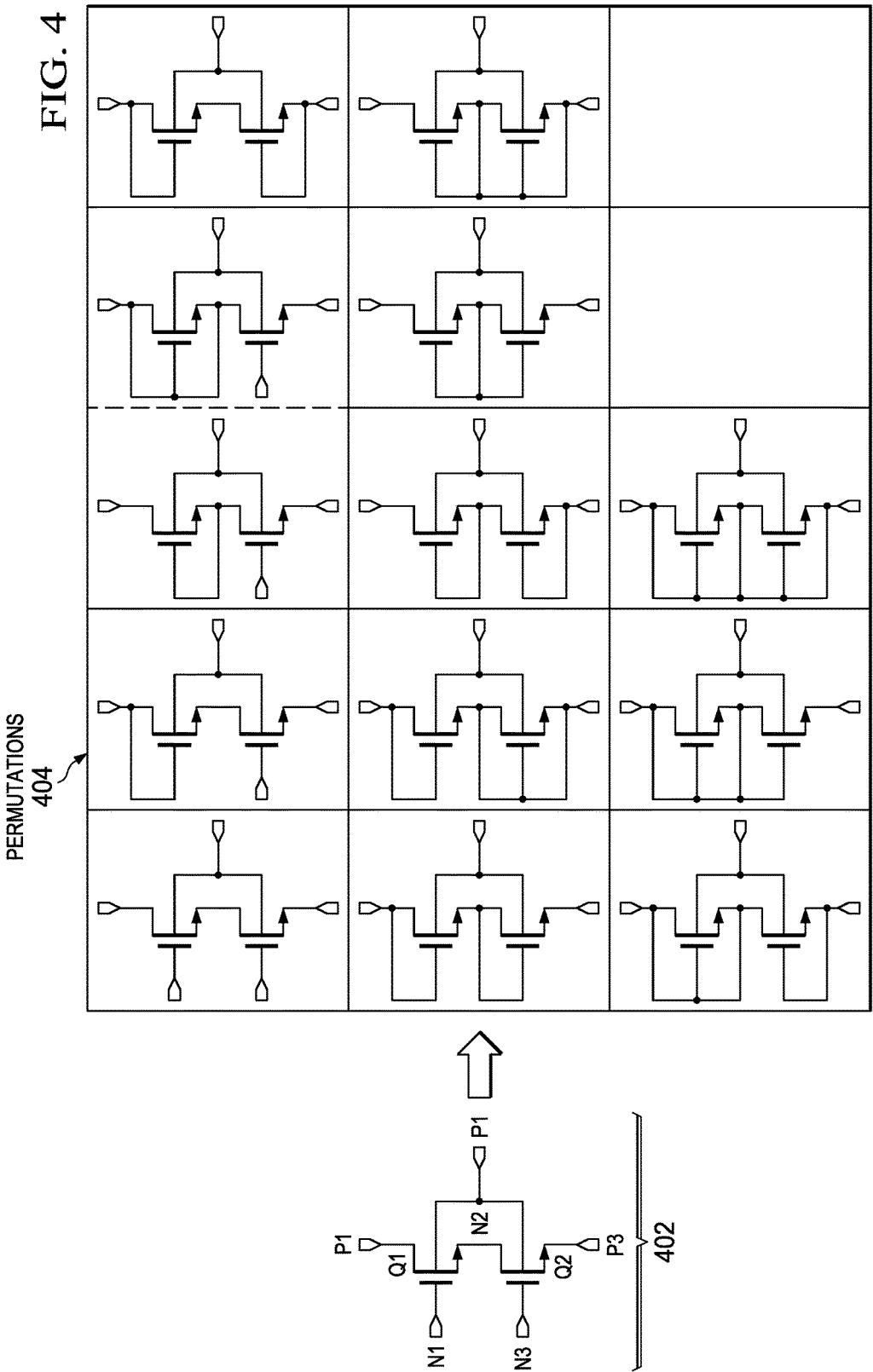

Now turning to FIG. 4, an example of a portion of the operation of system 200 can be seen. In this example, the fundamental devices are PMOS transistors (indicating that all other devices are skip devices as in steps 308 and 320) that use a conventional 0.25 µm CMOS process, but it should be noted that topology definitions are generally technology independent. Additionally, nodes N1, N2, and N3 from circuit 402 (which is an example of a generic topology retrieved from topology database 204) can be shorted to one another and can be shorted to pads P1 and P2 (which can be identified in step 310 and 312). Based on this information, engine 202 can retrieve the relevant technology rules from rules database 206 (from step 322). Engine 202 can then generate permutations 404, which are the generated topologies of step 324, so that each permutation can be compared to a subject design.

Figure 5:
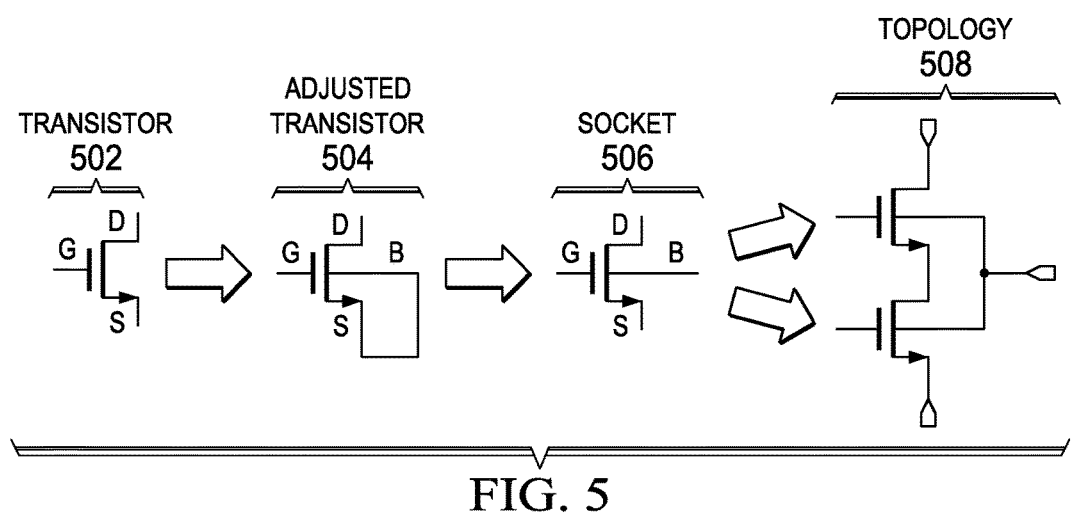

Turning to FIG. 5, an example of socket matching of step 314 can be seen. As shown, transistor 502 has four electrodes (gate, source, drain, and substrate) and is used in the definition of 2 NMOS transistors of topology 508. Transistor 502 is one NMOS transistors in CMOS 0.25 um technology and has three pins (gate, source and drain). Footprint adjustment is performed on transistor 502 to convert it to adjusted transistor 504, which includes the substrate node added that is shorted to the source node. The adjusted transistor 504 now fits into the socket 506 for circuit topology 508.

In FIG. 6, an example ESD analysis can be seen. Here, a layout 402 for a bit cell formed using a conventional 180 nm CMOS process technology is provided. Based on this layout 402, the engine 202 compares portions (such as portion 404) of the layout 402 to generated topologies (step 324) based on the ESD rules (from database 206) for the technology (conventional 180 nm CMOS process technology), the generic topologies (stored in database 204), and the topology map (identified in steps 308, 310, 314, 316, 318, and 320). Once a generated topology has been identified, the engine 200 can generate an assessment (in step 328) indicating the ESD sensitivity of layout 602.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A device comprising a processor configured to:
receive a circuit design;
receive a list of fundamental devices, wherein at least one fundamental device in the list of fundamental devices is a transistor;
receive a topology map for the circuit design;
retrieve rules based at least in part on the list of fundamental devices and the topology map;
retrieve a set of generic circuit topologies from a topology database, at least one of the generic circuit topologies including at least two fundamental devices in the list of fundamental devices, wherein at least one fundamental device in the at least two fundamental devices is a transistor;
generate a plurality of circuit topologies from the at least one of the generic circuit topologies based at least in part on the retrieved rules, the list of fundamental devices, and the topology map, each of the circuit topologies including the at least two fundamental devices in the list of fundamental devices;
compare at least a portion of the circuit design to the plurality of circuit topologies to identify which of the circuit topologies are present in the circuit design; and
analyze the circuit design based at least in part on the comparison of the portion of the circuit design to the plurality of circuit topologies.

2. The device of claim 1, wherein the topology map defines nodes that can be shorted together.

3. The device of claim 2, wherein the processor is further configured to generate permutations for each generic topology based at least in part on the nodes that can be shorted together.

4. The device of claim 1, wherein the topology map defines nodes that can be shorted to pads.

5. The device of claim 4, wherein the processor is further configured to generate permutations for each generic topology based at least in part on the nodes that can be shorted to the pads.

6. The device of claim 1, wherein the topology map defines device sockets.

7. The device of claim 6, wherein the processor is further configured to:
determine a technology for the circuit design; and
match fundamental devices from the fundamental device list within the technology to the device sockets.

8. The device of claim 7, wherein the technology is a BiCMOS process technology.

9. The device of claim 1, wherein the processor is further configured to determine electrostatic discharge (ESD) sensitivity of the circuit design based at least in part on the comparison of the portion of the circuit design to the plurality of circuit topologies.

10. The device of claim 1, wherein the topology map defines fundamental devices coupled in parallel to one another.

11. The device of claim 1, wherein the topology map defines fundamental devices coupled in series to one another.

12. A non-transitory computer-readable medium comprising computer code that, when executed by a processor, causes the processor to:
receive a circuit design;
receive a list of fundamental devices;
receive a topology map for the circuit design;
retrieve rules based at least in part on the list of fundamental devices and the topology map;
retrieve a set of generic circuit topologies from a circuit topology database, at least one of the generic circuit topologies including at least two fundamental devices in the list of fundamental devices;
generate a plurality of circuit topologies from the set of generic circuit topologies based at least in part on the retrieved rules, the list of fundamental devices, and the topology map, each of the circuit topologies including the at least two fundamental devices in the list of fundamental devices;
compare at least a portion of the circuit design to the plurality of circuit topologies to identify which of the circuit topologies are present in the circuit design; and
analyze the circuit design based at least in part on the comparison of the portion of the circuit design to the plurality of circuit topologies.

13. The non-transitory computer-readable medium of claim 12, wherein the topology map defines nodes that can be shorted together.

14. The non-transitory computer-readable medium of claim 13, wherein the computer code that causes the processor to generate the plurality of circuit topologies from the set of generic circuit topologies includes computer code that, when executed, causes the processor to generate permutations for each generic topology based at least in part on the nodes that can be shorted together.

15. The non-transitory computer-readable medium of claim 12, wherein the topology map defines nodes that can be shorted to pads.

16. The non-transitory computer-readable medium of claim 15, wherein the computer code that causes the processor to generate the plurality of circuit topologies from the set of generic circuit topologies includes computer code that, when executed, causes the processor to generate permutations for each generic topology based at least in part on the nodes that can be shorted to the pads.

17. The non-transitory computer-readable medium of claim 12, wherein the topology map defines device sockets.

18. The non-transitory computer-readable medium of claim 17, wherein the computer code that causes the processor to generate the plurality of circuit topologies from the set of generic circuit topologies includes computer code that, when executed, causes the processor to:
   determine a technology for the circuit design; and
   match fundamental devices from the fundamental device list within the technology to the device sockets.

19. The non-transitory computer-readable medium of claim 18, wherein the technology is a BiCMOS process technology.

20. The non-transitory computer-readable medium of claim 12, wherein the computer code that causes the processor to analyze the circuit design includes computer code that, when executed, causes the processor to determine ESD sensitivity of the circuit design based at least in part on the comparison of the portion of the circuit design to the plurality of circuit topologies.

21. The non-transitory computer-readable medium of claim 12, wherein the topology map defines fundamental devices coupled in parallel to one another.

22. The non-transitory computer-readable medium of claim 12, wherein the topology map defines fundamental devices coupled in series to one another.

* * * * *